United States Patent
Tu

(10) Patent No.: US 6,736,982 B2
(45) Date of Patent: May 18, 2004

(54) MICROMACHINED VERTICAL VIBRATING GYROSCOPE

(76) Inventor: Xiang Zheng Tu, 1293 Westwood St., Redwood City, CA (US) 94061

(*) Notice: Subject to any disclaimer, the term of this patent is extended or adjusted under 35 U.S.C. 154(b) by 487 days.

(21) Appl. No.: 09/882,569

(22) Filed: Jun. 15, 2001

(65) Prior Publication Data

US 2002/0189350 A1 Dec. 19, 2002

(51) Int. Cl.[7] .............................. B81B 3/00
(52) U.S. Cl. ............... 216/2; 216/39; 216/55; 216/62; 216/79; 438/50; 427/527
(58) Field of Search ............... 216/2, 39, 55, 216/62, 79; 29/596; 438/50, 52; 427/527, 532, 535

(56) References Cited

U.S. PATENT DOCUMENTS

| | | | |
|---|---|---|---|
| 4,910,165 A | * 3/1990 | Lee et al. | 438/409 |
| 5,199,298 A | * 4/1993 | Ng et al. | 73/54.01 |
| 5,242,863 A | * 9/1993 | Xiang-Zheng et al. | 438/53 |
| 6,294,909 B1 | * 9/2001 | Leedy | 324/207.17 |
| 6,602,714 B1 | * 8/2003 | Tagge et al. | 436/2 |

* cited by examiner

Primary Examiner—Allan Olsen
(74) Attorney, Agent, or Firm—Bruce H. Johnsonbaugh

(57) ABSTRACT

A micromachined vertical vibrating gyroscope consists of three single crystal silicon assemblies: an outer single crystal silicon assembly, an intermediate single crystal silicon assembly, and an inner single crystal silicon assembly. The outer assembly includes a plurality of arc-shaped anchors arranged in a circle and extending from a single crystal silicon substrate coated with an insulating annulus thereon. The intermediate assembly is a suspended wheel concentric with the arc-shaped anchors. The inner assembly is a suspended hub concentric with the circle formed by the anchors and having no axle at its center. The three assemblies are connected to each other through several flexures. The intermediate suspended wheel is driven into rotational vibration by lateral comb capacitors. Input angular rates are measured by two vertical capacitors. The gyroscope is fabricated utilizing a bipolar-compatible process comprising steps of buried layer diffusion, selective epitaxial growth and lateral overgrowth, deep reactive ion etching, and porous silicon processing.

8 Claims, 4 Drawing Sheets

MICROMACHINED VERTICAL VIBRATING GYROSCOPE

FIELD OF THE INVENTION

The present invention relates to a micromachined gyroscope and more particularly, to a micromachined gyroscope performing lateral sensing of angular rates, having both driving and sensing oscillation modes, and having all components formed from a single silicon crystal of a single silicon wafer.

BACKGROUND OF THE INVENTION

Gyroscopes are used to measure the angular deviation of a guided missile from its desired flight trajectory; to determine the heading of a vehicle for steering; to determine the heading of an automobile as it turns; to indicate the heading and orientation of an airplane during and after a series of maneuvers; or to stabilize and point radar dishes and satellites. Recently, micromachined gyroscopes are receiving increasing attention because of their low cost, small size and high sensitivity. Micromachined vertical or z-axis gyroscopes are used to counteract the rolling effect on a vehicle, and thus, are a preferred stabilization tool for vehicles such as airplanes, ships, and cars.

One developed micromachined vertical gyroscope utilizes a rapidly spinning, heavy mass. These spinning mass gyroscopes require lubrication and eventually wear out.

Another developed micromachined vertical gyroscope is based on vibration mode, but uses polysilicon technology. All suspension structures of this gyroscope are made of a polysilicon layer. To release the suspension structures a thick sacrificial layer is applied beneath the polysilicon layer. After the polysilicon layer is etched through, the sacrificial layer is removed. There are several problems with this gyroscope.

Although a single crystal silicon wafer may be used as a substrate of the gyroscope, the single crystal silicon wafer with several additional layers thereon is no longer suitable for standard microelectronics processing to realize monolithic integration.

An as-deposited polysilicon layer is in compressive strain. Suspension structures formed from the strain polysilicon layer tend to buckle, causing gyroscope instability or inability to work.

Since the surface of a relatively thick polysilicon layer is quite rough an additional polishing step is required before a planar processing process.

It is impossible to deposit a relatively thick polysilicon layer with device quality. This limits the stiffness of the suspension flexures in the vertical direction and makes electrostatic comb drive levitation more difficult to control.

SUMMARY OF THE INVENTION

Accordingly, it is an object of the present invention to provide a micromachined vertical vibrating gyroscope with all suspension structures being of single crystal silicon. The use of single crystal silicon structure eliminates the problems of the prior art caused by utilizing polysilicon as a building material.

It is a further object of the present invention to provide a micromachined vertical vibrating gyroscope with all suspension structures recessed into a processed silicon wafer. These recessed structures are more robust than any structures being out of the plane of the processed silicon wafer.

It is a still further object of the present invention to provide a micromachined vertical vibrating gyroscope capable of being produced by processing a single silicon wafer. Since no other wafer is required, the process is simple and allows batch production.

It is a still further object of the present invention to provide a micromachined vertical vibrating gyroscope capable of being fabricated on a single processing plane all along. This facilitates the use of standard planar processing technologies for integrated circuits.

A still further object of the present invention to provide a micromachined vertical vibrating gyroscope capable of being electronically integrated with other electronics similarly fabricated on the same chip so as to realize monolithic integration.

In accordance with these and other objects, a micromachined vertical vibrating gyroscope is described. The gyroscope consists of three single crystal silicon assemblies: an outer single crystal silicon assembly, an intermediate single crystal silicon assembly, and an inner single crystal silicon assembly. The outer assembly includes a plurality of arc-shaped anchors arranged in a circle and extending from a single crystal silicon substrate coated with an insulating annulus thereon. Each of at least four anchors support a suspension flexure and two suspension fan-shaped stops on its inner edge. The intermediate assembly is a suspension wheel possessing a same center with the circle and having a plurality of combs protruding from its outer edge. The linkage between the outer assembly and the intermediate assembly is realized through the four suspension flexures arranged along two orthogonal axes. The inner assembly is a suspension hub possessing a same center with the circle and no axle at its center. The linkage between the intermediate assembly and the inner assembly is realized through other two flexures arranged along a same axis. The intermediate suspension wheel is driven into rotational vibration by lateral comb capacitors. Each lateral comb capacitor is formed by a combination of a comb protruding from an anchor and a comb protruding from the intermediate wheel. Input angular rates are measured by two vertical capacitors that are formed between the bottom of the inner suspension hub and the interior top surface of the substrate used to support the anchors.

The micromachined vertical vibrating gyroscope is fabricated utilizing a bipolar-compatible process. This process comprises the steps of forming a buried layer, depositing and patterning an insulation layer, and growing an epitaxial layer. The epitaxial layer grown on the buried layer is of single crystal silicon and on the insulation layer is of lateral overgrown single crystal silicon. After converting the buried layer into a porous silicon layer all suspension structures are formed by partially etching into the epitaxial layer and removing the beneath porous silicon layer. The rest of the porous silicon layer is turned into an oxidized porous silicon layer for electrically isolating the anchors located thereon.

DETAILED DESCRIPTION OF THE INVENTION

Figure 1:
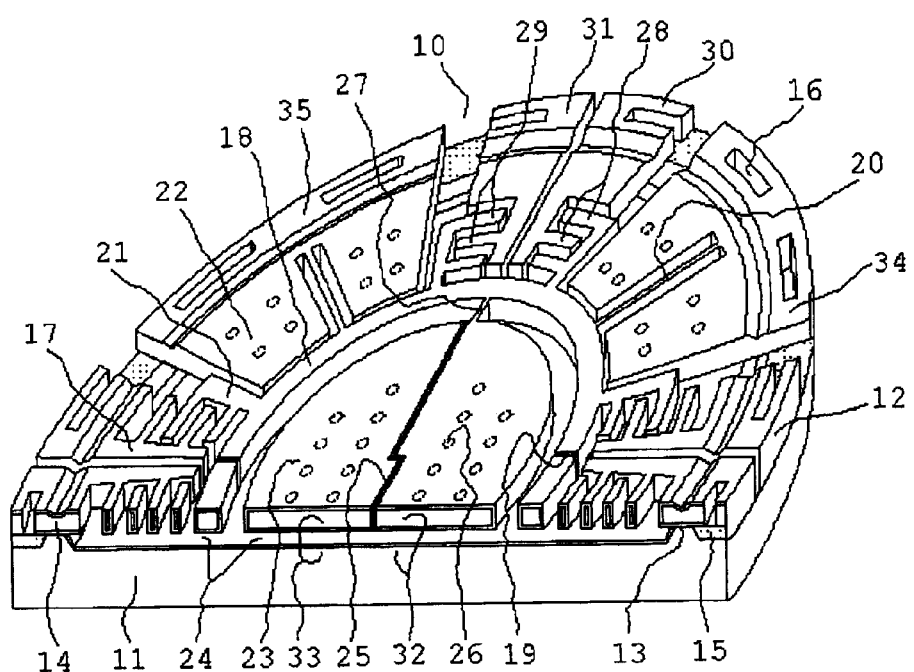
FIG. 1 is a partially cut away perspective view of a micromachined vertical vibrating gyroscope in accordance with the present invention.

Referring now to FIG. 1, a micromachined vertical vibrating gyroscope 10 includes a single crystal silicon substrate 11 with an epitaxial layer thereon. The epitaxial layer includes three regions: an outer periphery region, an intermediate ring region 18, and an inner circle or hub region 23. The outer periphery region is originally grown from the surface of the substrate, but later the beneath layer turns into an oxidized porous silicon layer 15; an outer ring region 14 is extended from beneath insulating ring 13 that is coated on the surface of the substrate 11. The inner circle region (hub 23) also is originally grown from the surface of the substrate 11, but later the beneath layer is removed to leave an air gap 24 therein. The whole epitaxial layer including the intermediate ring region 18 is single crystal silicon with same crystalline properties as the substrate 11. Also shown are a plurality of arc-shaped anchors 12 that are arranged in a circle and each having several through holes 16 therein, an intermediate vibrating wheel 18 that has a same center with the circle formed by anchors 12, and an inner vibrating hub 23 that also has the same center with the circle formed by anchors 12. The arc-shaped anchors 12 form a circle that is concentric with the circles formed by the intermediate vibrating wheel and hub 23.

Each of the arc-anchors 12 comprises of an outer portion and an inner portion. The outer portion is made of the outer periphery region of the epitaxial layer that is disposed on the oxidized porous silicon layer 15. The inner portion is made of the ring region of the epitaxial layer that is disposed on the insulating ring 13.

There are at least four anchors 12, each supporting a suspended single-crystal silicon flexure 20 and two suspended and perforated fan-shaped single crystal silicon mechanical stops 22 that sandwich the flexure 20. Each of the rest anchors supports a suspended single crystal silicon comb 17 with a plurality of side fingers extending from its one side.

The flexures 20 are arranged to align with the coordinate x-axis and y-axis, respectively, which are set on the substrate plane. The aspect ratio of the flexures 20 is relatively high so that they are stiff in response to the vertical motion and flexible in response to the lateral motion. With these features the wheel 18 is easy to stimulate to rotate about the vertical axis or the coordinate z-axis, but not to move along the coordinate x-axis and y-axis, and rotate about the coordinate x-axis and y-axis.

The wheel 18 is made of the inner circle region of the epitaxial layer that is separated from the substrate 11 by the air gap 24. Along the central line there are two insulating trenches 19 to divide the wheel 18 into two area-equaled half-wheels. The four flexures 20 join the wheel 18 and the anchors 12 so that the anchors 12 indirectly support the wheel 18. There are at least eight suspended single crystal silicon combs 21 extending from the outer edge of the wheel 18 so that each two of which sandwich an adjacent two comb 17. The combs 21 also have a plurality of side fingers extending from their one side. Each comb 21 combines with a comb 17 so that their side fingers are interdigitated.

The hub 23 is also made of the inner circle region of the epitaxial layer that is separated from the substrate 11 by the air gap 24. Along a zigzag line there are insulating trenches 25 to divide the hub 23 into two area-equaled half-hubs. A plurality of damping holes 26 are scattered in the hub 23. There are also two suspended single crystal silicon flexures 27 that join the wheel 18 and the hub 23 so that the anchors 12 also indirectly support the hub 23.

The flexures 27 are arranged along the extending direction of the central symmetric line of the hub 23. One flexure 27 electrically connects a half-hub to two outer bonding pads 34 and 35. The other flexure 27 (not shown in the figure) electrically connects the other half-hub to other two bonding pads (not shown in the figure). The bonding pads are disposed on the anchors 12 that are electrically isolated from the substrate 11 by the insulating ring 13 and the oxidized porous silicon layer 15. The geometric shape of the flexures 27 is designed to be stiff in response to the vertical motion of the hub 23 and flexible in response to the rotation of the hub 23 about their longitudinal direction.

The micromachined vertical vibrating gyroscope 10 further comprises at least four lateral driving capacitors 28 and four lateral monitoring capacitors 29. The lateral drive capacitors 28 and the lateral monitoring capacitors 29 are located in four symmetric fan-shaped regions. Each fan-shaped region contains a lateral driving capacitor and a lateral monitoring capacitor. Each lateral capacitor for driving or monitoring of the vibration of the wheel 18 consists of two combs. One comb extends from an anchor 12 and the other comb extends from the wheel 18. The fingers of the two combs are interdigitated with each other so that each two opposite fingers are faced sidewall to sidewall.

The micromachined vertical vibrating gyroscope 10 further comprises two vertical measuring capacitors 32 and 33. The vertical measuring capacitors are formed from the electrodes attached to the bottom of the hub 23 and to the inner top surface of the substrate 11 respectively. The hub 23 is electrically divided into two area-equaled half-hubs by the insulating trench 25. Each half-hub has an independent electrode attached thereon and electrically connects to two shown outer bonding pads 34 and 35 or other two un-shown outer bonding pads through the shown flexure 27 or the other un-shown flexure.

The electrodes of the vertical measuring capacitors 32 and 33 are formed from a diffusion layer disposed on the bottom surface of the wheel 23 and the top surface of the substrate 11. Different from this, the electrodes of the lateral capacitors 28 and 29 are formed from a metal layer deposited on the sidewalls of the figures of the combs 17 and 21. An insulating layer separates these two kinds of the electrodes (not shown in FIG. 1). Even though both the electrodes of the vertical capacitors 32 and 33 and the lateral capacitors 28 and 29 have common supporting silicon structures they are electrically isolated by this insulating layer.

Under the inner portion of each anchor 12 there is a cavity with the insulating ring 13 on its top. It can be seen that the cavity has two functions. The first function is to prevent the two diffusion layers of the electrodes of the vertical capacitors 32 and 33 from joining together at this point. The second function is to stop the metal layer of the electrodes of the lateral capacitors 28 and 29 to continuously extend to the interior top surface of the substrate 11. Because of this, the lateral capacitors 28 and 29 and vertical capacitors 32 and 33 can be electrically isolated each other.

In operation of the micromachined vertical vibrating gyroscope 10 a voltage is applied to the lateral driving capacitors 28. The intermediate wheel 18 is then stimulated into rotational vibration about the coordinate z-axis that is set to be vertical to the substrate plane. For the rotational vibration of the wheel 18, the flexures 20 provide flexible mechanical support. As the rotational angular becomes too large the stops 22 begin to abate the vibration so as to prevent the flexures 20 from damaging. The lateral monitoring capacitors 29 is used to measure the frequency and amplitude of the rotational vibration of the wheel 18. When the substrate 11 experiences an angular rate about the coordinate x-axis that is set to be perpendicular to the flexures 27 a Coriolis force is induced. The Coriolis force exerts on the inner vibrating hub 23 and causes the hub 23 to be rotationally vibrated about the coordinate y-axis.

In the balance state the two vertical capacitors 32 and 33 are designed to be completely equal. When the hub 23 rotates about the coordinate y-axis, the two vertical capacitors 32 and 33 are no longer equal. If the hub 23 rotates counterclockwise, the capacitance of the vertical capacitor 33 will increase and the capacitance of the vertical capacitor 32 will decrease. If the rotation direction reverses, the difference of the capacitance also reverses. Since the difference of the capacitance of the two vertical capacitors 32 and 33 depends upon the input angular rate, the input angular rate can be determined by measuring the difference of the capacitance of the two vertical capacitors 32 and 33.

The measurement circuit can be adopted in open loop or in close loop. In open loop the amplitude of a carrier signal can be modulated by the difference of the capacitance of the two vertical capacitors 32 and 33. After demodulation with the carrier frequency and the driving signal frequency a DC voltage proportional to the input angular rate can be yielded as the output of the measurement circuit. In close loop the yielded signal is first fed to a rebalance circuit. The rebalance circuit then provides a rebalance voltage applying to the vertical capacitors 32 and 33 to null the rotation of the inner vibrating hub 23 about the coordinate y-axis. The rebalance voltage is proportional to the input angular rate.

Figure 2:
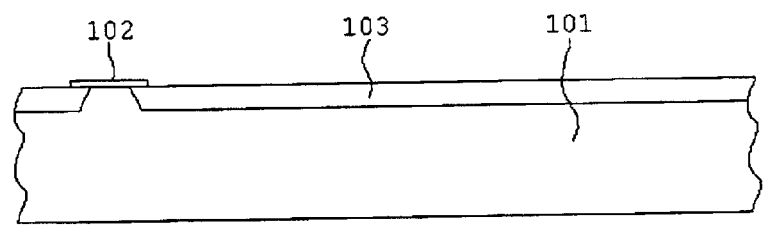
FIG. 2 is a cross-sectional view of a buried layer formed in a single crystal silicon substrate for fabricating the vertical vibrating gyroscope of FIG. 1 in accordance with the present invention.

The micromachined vertical vibrating gyroscope 10 is fabricated, in accordance with the present invention, utilizing a bipolar compatible process. In this process surface micromachining can be carried out as a number of post-processing steps after completion of a standard bipolar process. The bipolar compatible process, which is diagrammatically illustrated in FIGS. 2–11, begins with a single crystal silicon wafer used as a substrate 101, as shown in FIG. 2. The substrate 101 is an (100) n-type silicon wafer with a resistivity ranging from 1 to 10 ohm-cm, typically being 3 ohm-cm. A 1 micron-thick silicon dioxide layer 102 is thermally grown on the surface of the substrate 101. Photolithography is used to pattern the silicon dioxide layer 102, and then a heavily doped buried n-type or p-type layer 103 is formed in the substrate 101 by thermal diffusion or a combination of ion implantation and thermal annealing. The buried layer 103 has a sheet resistance ranging from 4 to 20 ohm/square, typically being 8 ohm/square, and thickness ranging from 1 to 5 micron, typically being 2 micron.

Figure 3:
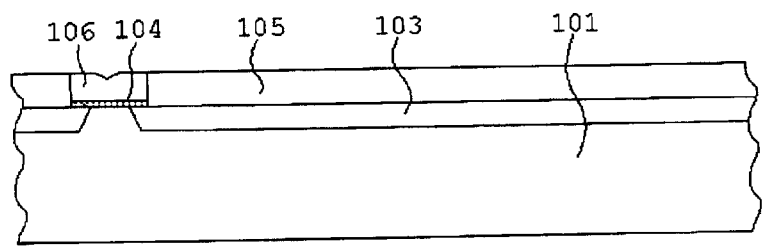
FIG. 3 is a cross-sectional view of an epitaxial single crystal silicon layer formed on the silicon exposed regions of the single crystal silicon substrate and a lateral overgrowth single crystal layer formed on an insulating ring of the single crystal silicon substrate for fabricating the vertical vibrating gyroscope of the FIG. 1 in accordance with the present invention.

As shown in FIG. 3, the next step is to perform a selective epitaxial growth process. Before doing that, a composite insulating ring 104 is formed on the surface of the substrate 101. The composite insulation layer is preferably comprised of silicon dioxide and silicon nitride. The silicon dioxide layer is formed by thermal oxidization and has a thickness ranging from 500 to 2000 angstrom, typically being 1000 angstrom. The silicon nitride layer is formed by low-pressure chemical vapor deposition (LPCVD) and has a thickness ranging from 400 to 1500 angstrom, typically being 1000 angstrom. Then, photolithography is conducted to create the composite insulation ring 104. The width of the insulating ring 104 ranges from 8 to 60 micron, typically is 14 micron.

Following patterning, the processed substrate is placed into an inductively heated reduced-pressure CVD pancake-type reactor. The reactor temperature is ramped to 970° C. in an $H_2$ ambient and a 5 min $H_2$ bake is performed to remove native oxide from the bottoms of the seed holes. After $H_2$ bake, 1.5 l/m of HCl is added to the ambient and a 30-s etching is performed. $SiH_2Cl_2$ (DCS) is then added to induce selective epitaxial growth of single crystal silicon. Reactor pressure during growth is 40 Torr. Flow rates for $SiH_2Cl_2$, HCl, and $H_2$ are 0.22, 0.66, and 60 l/m, respectively. The epitaxial growth proceeds not only in the vertical direction, but also in the lateral direction. Therefore, a vertical epitaxial layer 105 is grown to cover the buried layer 103 and a lateral overgrowth layer 106 is grown to cover the composite insulation ring 104. Since the lateral epitaxial growth proceeds from the two opposite sides of the insulating ring 104 the formed lateral overgrowth layer meets together at the central line of the insulating ring 104 and results in a shallow trench therein. The resistivity of the epitaxial layer 105 may be varied between 1 and 10 ohm-cm, typically is 3 ohm-cm, and a thickness may be varied between 5 and 40 micron, typically is 10 micron.

Figure 4A:
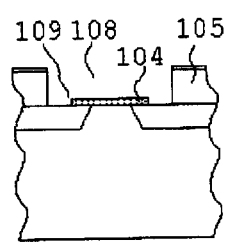
FIGS. 4A and 4B are cross-sectional views showing an empty trench formed in the epitaxial single crystal silicon layer and showing an etch depth indication cavity formed in the lateral overgrowth single crystal silicon layer for fabricating the vertical vibrating gyroscope of FIG. 1 in accordance with the present invention.
Figure 4B:
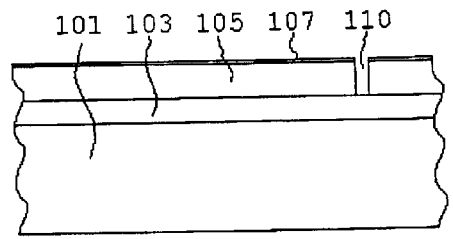

Turning now to FIGS. 4A and 4B, these figures illustrate the fabrication process of the insulating trenches of FIG. 1. The trenches 108 and 110 shown in FIGS. 4A and 4B are cut from the processed substrate shown in FIG. 3. FIG. 4A shows the substrate 101, buried layer 103, insulating ring 104, epitaxial layer 105, and lateral overgrowth layer 106. The processed substrate shown in FIG. 4B already contains the substrate 101, buried layer 103, and epitaxial layer 105. As the first step for the fabrication process, a silicon dioxide layer 107 is formed by thermal oxidization on the surface of the epitaxial layer 105 and the lateral overgrowth layer 106. Then the silicon dioxide layer 107 is patterned to create silicon-exposed windows therein.

Figure 5:
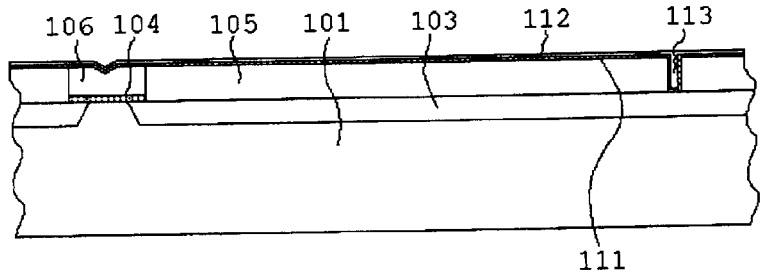
FIG. 5 is a cross-sectional view of an insulating material filled trench formed in the epitaxial single crystal silicon layer for fabricating the vertical vibrating gyroscope of FIG. 1 in accordance with the present invention.
Figure 6:
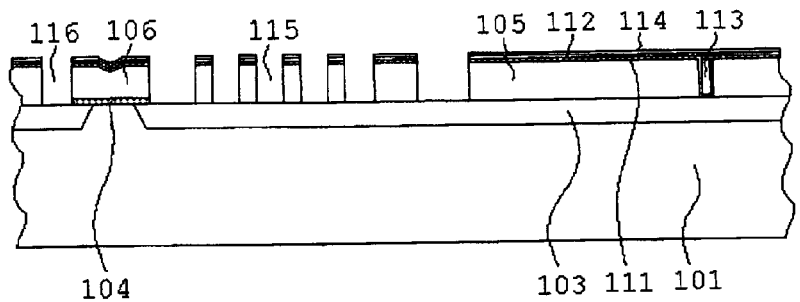
FIG. 6 is a cross-sectional view of a plurality of empty trenches formed in the epitaxial single crystal silicon layer for fabricating the vertical vibrating gyroscope of FIG. 1 in accordance with the present invention.

The next step is to perform deep reactive ion etching (DRIE) using the patterned silicon dioxide layer 107 as a protection mask. As shown in FIG. 5, the formed empty trench 110 is required to lower through the epitaxial layer 105 and reach the buried layer 103. For this purpose, an etch monitoring cavity 108 is created, as shown in FIG. 4A. As the etching goes on, the insulating ring 104 is first exposed on the bottom of the cavity 108 and then an etch step 109 is formed at the edge of the insulating ring 104. The height of the etch step 109 is used as an indication of the etch end. The width of the empty trench 110 ranges from 1 to 3 micron, typically is 2 micron. The width of the cavity 108 may be varied between 50 and 200 micron, typically is 100 micron. The cavity 108 is preferably located in the central region of the processed substrate.

As shown in FIG. 5, the empty trench 110 is turned into a filled trench 113 by being filled up with silicon nitride and polysilicon. The nitride layer 111 is deposited by low pressure chemical vapor deposition (LPCVD). Since LPCVD is a conformable coating the inside surface of the empty trench 110 can be covered uniformly. The thickness of the silicon nitride layer 111 ranges from 800 to 2000 angstrom, typically is 1000 angstrom. The polysilicon layer 112 is deposited also by LPCVD. The thickness of the polysilicon layer 112 is little larger than a half width of the empty trench 110 so that the empty trench is filled up completely.

It should be noted that, although the filled trench 113 of FIG. 5 only corresponds to the insulating trench 25 of FIG. 1, the insulating trench 19 of FIG. 1 is formed in the same process.

The continuing step, as shown in FIG. 6, is to perform DRIE again to create a plurality of trenches in the epitaxial layer 105. To do this a silicon dioxide layer 114 is deposited by LPCVD. Then photolithography is used to pattern the stack layer of the silicon nitride layer 111, polysilicon layer 112, and silicon dioxide layer 114 for creating silicon-exposed windows therein. Using the patterned stack layer as a protection mask, a DRIE process is carried out. This process is to create trenches 115 and 116 that pass through the epitaxial layer 105 and reach the buried layer 103.

It should be noted that for this process another etch monitoring cavity (not shown in the figure) is used to accurately control the depth of the etching.

Figure 7:
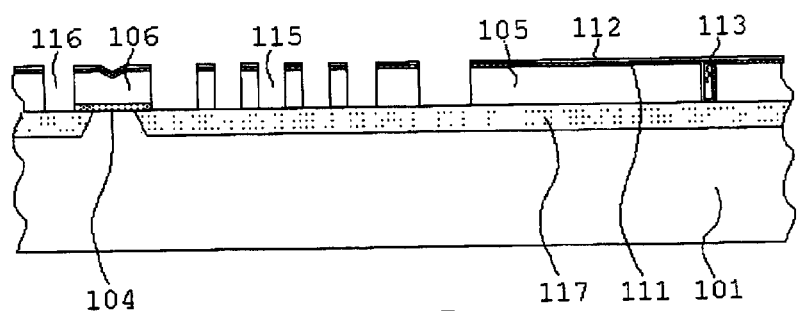
FIG. 7 is a cross-sectional view of a porous silicon layer replacing the buried layer for fabricating the vertical vibrating gyroscope of FIG. 1 in accordance with the present invention.

As shown in FIG. 7, the next step is to convert the buried layer 103 into a porous silicon layer 117. Since the buried layer 103 is heavily doped it is preferable to anodize in HF solution than lightly doped substrate 101 and lightly doped epitaxial layer 105 and lateral overgrowth layer 106.

The used HF solution consists of one third of HF, one third of ethanol and one third of water. The used etching apparatus consists of a double tank cell separated by the processed substrate. For the process the two volumes of the HF solution are individually contacted by Pt grids. The frond side surface of the processed substrate faces the cathodically biased grid while the rear surface faces the anodically biased grid in the other tank.

It should be noted that a plurality of through holes in the inner hub 23 of FIG. 1 provide entries for the HF solution to attack the buried layer 103 so as to shorten the lateral anodization path and reduce the anodization time.

After forming porous silicon in selected areas of the processes substrate, a photoresist layer 118 is applied to cover the trenches 116. Then the processed substrate is immersed into a diluted KOH solution (1% KOH in $H_2O$) at room temperature to remove the porous silicon layer 117 in the selective area. This results in suspension components 121, 122, 123, air gap 119, and cavity 120, as shown in FIG. 8.

Figure 8:
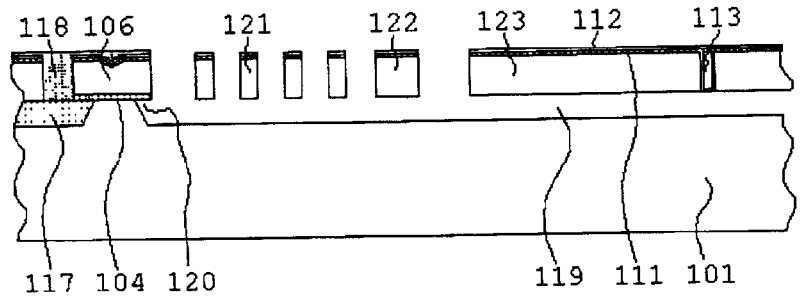
FIG. 8 is a cross-sectional view of a plurality of suspension structures formed by partially removing the porous silicon layer and an oxidized porous silicon layer replacing the rest of the porous silicon layer for fabricating the vertical vibrating gyroscope of FIG. 1 in accordance with the present invention.

It should be noted that the suspension components 121, 122, 123 only correspond to the fingers of the combs 17, the immediate vibrating wheel 18, and the inner vibrating hub 23 of FIG. 1, the other suspension structures of FIG. 1, which are not shown in FIG. 8, are also formed in the same process.

Figure 9:
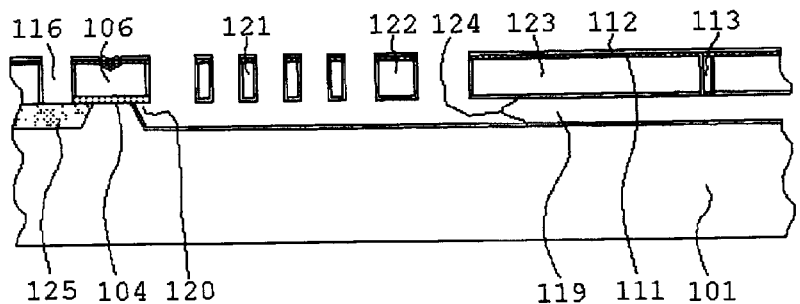
FIG. 9 is a cross-sectional view of a heavily doped diffusion layer formed on the surfaces of the suspension structures for fabricating the vertical vibrating gyroscope of FIG. 1 in accordance with the present invention.

After forming the suspension structures, a thin heavily doped diffusion layer 124 is formed on the surfaces of the suspension structures, as shown in FIG. 9. The diffusion process comprises of pre-deposition with $POCl_3$ at 950° C. for 30 min and post-diffusion at a temperature ranging from 900 to 1000° C., typically 950° C. in oxygen atmosphere for 30 min. During the diffusion step the porous silicon layer 117 is turned into an oxidized porous silicon layer 125. The oxidized porous silicon is similar to the silicon dioxide and can be used as an electrically insulating material.

It should be noted that the insulating ring 104 of the cavity 120 separates the diffusion layer 124 into two independence portions: one portion disposed on the bottom of the suspension structures and the other portion disposed on the interior top surface of the substrate 101.

It also should be noted that a plurality of through holes in the inner hub 23 of the FIG. 1 exist to make the diffusion layer 124 of FIG. 9 more uniform on the bottom of the hub 23 of FIG. 1.

Figure 10:
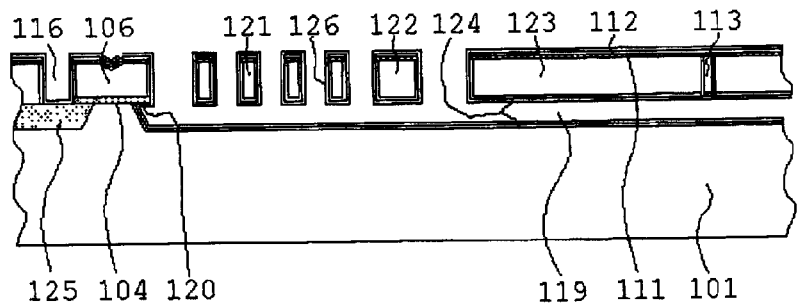
FIG. 10 is a cross-sectional view of an insulating layer coated on the diffusion layer for fabricating the vertical vibrating gyroscope of FIG. 1 in accordance with the present invention.

Next, a silicon nitride layer 126 is deposited by LPCVD to coat the surfaces of the suspension structures, as shown in FIG. 10.

Figure 11:
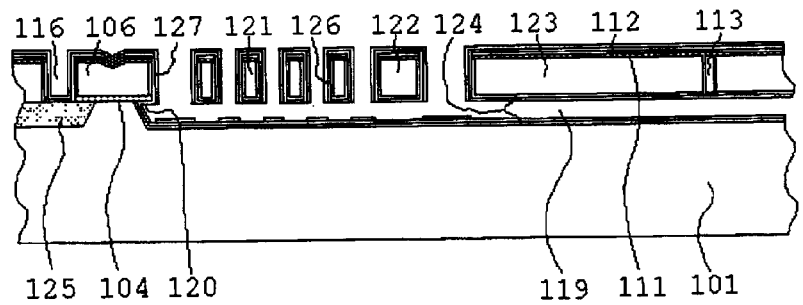
FIG. 11 is a cross-sectional view of a metal layer deposited on the sidewalls of the suspension structures for fabricating the vertical vibrating gyroscope of FIG. 1 in accordance with the present invention.

Thereafter, a metal layer 127, such as an aluminum layer is deposited by sputtering on the surfaces of the suspension structures. Since sputtering does not achieve conformal coating the aluminum layer 127 only forms on the top surfaces and sidewalls of the suspension structures, as shown in FIG. 11. Therefore, there is no aluminum layer on the bottom of the insulating ring 104.

It should be noted that the suspension structures are coated with three layers thereon: the bottom diffusion layer 124, immediate silicon nitride layer 126, and top aluminum layer 127. The bottom diffusion layer 124 and top aluminum layer 127 are conduction layers, but they are not electrically connected due to the immediate silicon nitride layer 126 inserted between them.

Although the present invention has been disclosed in terms of the preferred embodiments, it will be understood that modifications and variations can be made without departing from the true spirit and scope thereof, as set forth in the following claims.

What is claimed is:

1. A method for fabricating a micromachined vertical vibrating gyroscope comprising steps of
   a) providing a lightly doped single crystal silicon substrate;
   b) forming a heavily doped buried layer in the substrate;

c) forming an insulating ring on the surface of the substrate;
d) performing selective epitaxial growth to form a vertical epitaxial single crystal silicon layer on the exposed silicon surface of the substrate and a lateral overgrowth single crystal silicon layer on the insulating ring;
e) conducting first deep reactive ion etching to form first trenches in the vertical epitaxial layer;
f) filling up the first trenches with an insulating material(s);
g) conducting second deep reactive ion etching to form second trenches in the vertical epitaxial layer;
h) performing anodization to convert the buried layer into a porous silicon layer;
i) removing a portion of the porous silicon layer to form suspension structures;
j) conducting pre-deposition with a diffusion source;
k) conducting post-diffusion in oxygen atmosphere to form a heavily doped single crystal silicon layer on the surfaces of the suspension structures and turn the rest of the porous silicon layer into an oxidized porous silicon layer;
l) performing low pressure chemical vapor deposition to form an insulating layer on the surfaces of the suspension structures; and
m) depositing a metal layer on the top surfaces and sidewalls of the suspension structures.

2. The method for fabricating a micromachined vertical vibrating gyroscope of claim 1, wherein said insulating ring comprises silicon dioxide and silicon nitride.

3. The method for fabricating a micromachined vertical vibrating gyroscope of claim 1, wherein said insulating ring has a width ranging from 8 to 60 micron.

4. The method for fabricating a micromachined vertical vibrating gyroscope of claim 1, wherein said vertical epitaxial layer has a thickness ranging from 5 to 40 micron.

5. The method for fabricating a micromachined vertical vibrating gyroscope of claim 1, wherein said first trenches have a width ranging from 1 to 3 micron.

6. The method for fabricating a micromachined vertical vibrating gyroscope of claim 1, wherein said second trenches have a width ranging from 1 to 3 micron.

7. The method for fabricating a micromachined vertical vibrating gyroscope of claim 1, wherein said diffusion source is $POCl_3$.

8. The method for fabricating a micromachined vibrating gyroscope of claim 1, wherein said post-diffusion is carried out in oxygen atmosphere at a temperature ranging from 900 to 1000° C.

* * * * *